US008741026B2

(12) United States Patent
Whitcomb

(10) Patent No.: US 8,741,026 B2
(45) Date of Patent: *Jun. 3, 2014

(54) BRANCHED NANOWIRE PREPARATION METHODS, COMPOSITIONS, AND ARTICLES

(75) Inventor: David R. Whitcomb, Woodbury, MN (US)

(73) Assignee: Carestream Health, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/460,859

(22) Filed: May 1, 2012

(65) Prior Publication Data

US 2012/0297927 A1 Nov. 29, 2012

Related U.S. Application Data

(60) Provisional application No. 61/488,992, filed on May 23, 2011.

(51) Int. Cl.
*B22F 9/24* (2006.01)
*B22F 9/16* (2006.01)
*B82Y 40/00* (2011.01)

(52) U.S. Cl.
USPC .............................................. 75/371; 75/741

(58) Field of Classification Search
USPC ....................................................... 75/343
See application file for complete search history.

(56) References Cited

U.S. PATENT DOCUMENTS

| 7,749,299 | B2 * | 7/2010 | Vanheusden et al. | 75/362 |
| 2007/0054104 | A1 * | 3/2007 | Ittel et al. | 428/292.1 |
| 2009/0260423 | A1 * | 10/2009 | Munoz et al. | 73/61.71 |

FOREIGN PATENT DOCUMENTS

| JP | 2009-155674 | | 7/2009 |
| KR | 2001128152 | A | 11/2011 |
| KR | 2012005683 | A | 1/2012 |

OTHER PUBLICATIONS

Wei et al. Self-organized synthesis of silver chainlike and dendritic nanostructures via a solvothermal method, Chem. Mater. 2003, vol. 15, p. 4436-4441.*
Tang et al. Syntheses of silver nanowires in liquid phase, Nanowires Science and Technology, Feb. 2010, p. 25-42.*
Younan Xia, et al., Shape-Controlled Synthesis of Metal Nanocrystals: Simple Chemistry Meets Complex Physics?, Angew. Chem. Int. Ed. 2009, 48, pp. 60-103.
B. Wiley et al., Polyol synthesis of silver nanoparticles: Use of chloride and oxygen to promote the formation of single-crystal, truncated cubes and tetrahedrons, vol. 4, Issue 9, pp. 1733-1739, Sep. 2004.
Kylee Korte et al., Rapid synthesis of silver nanowires through a $CuCl$- or $CuCl_2$-mediated polyol process, Journal of Materials Chemistry, 2008, vol. 18, pp. 437-441.
Jinting Jiu, et al., Preparation of Ag nanorods with high yield by polyol process, Mat. Chem. & Phys., 2009, 114, pp. 333-338.
Srichandana Nandikonda, Microwave Assisted Synthesis of Silver Nanorods, M.S. Thesis, Auburn University, Aug. 9, 2010, 59 pages.

(Continued)

*Primary Examiner* — Roy King
*Assistant Examiner* — Xiaowei Su
(74) *Attorney, Agent, or Firm* — Reed L. Christiansen

(57) ABSTRACT

Branched nanowire preparation methods, compositions, and articles are disclosed. Such branched nanowires are useful for electronics and optical applications.

2 Claims, 5 Drawing Sheets

(56) References Cited

OTHER PUBLICATIONS

Shanthi Muralli et al., Lyotropic liquid crystalline self-assembly in dispersions of silver nanowires and nanoparticles, 2010, vol. 26, Issue 13, pp. 11176-11183.

Z.C. Li, Sodium chloride assisted synthesis of silver nanowires, IET Micro & Nano Letters, vol. 6, Issue 2, pp. 90-93, Feb. 2011.
Benjamin Wiley et al., Polyol Synthesis of Silver Nanostructures: Control of Product Morphology with Fe(II) or Fe(III) Species, Langmuir, The ACS Journal of Surfaces and Colloids, Aug. 2005, vol. 21, No. 18, pp. 8077-8080.

* cited by examiner

BRANCHED NANOWIRE PREPARATION METHODS, COMPOSITIONS, AND ARTICLES

CROSS REFERENCE TO RELATED APPLICATIONS

This application claims the benefit of U.S. provisional application No. 61/488,992, filed May 23, 2011, entitled BRANCHED NANOWIRE PREPARATION METHODS, COMPOSITIONS, AND ARTICLES, which is hereby incorporated by reference in its entirety.

BACKGROUND

The general preparation of silver nanowires (10-200 aspect ratio) is known. See, for example, *Angew. Chem. Int. Ed.* 2009, 48, 60, Y. Xia, Y. Xiong, B. Lim, S. E. Skrabalak, which is hereby incorporated by reference in its entirety. Such preparations typically employ $Fe^{2+}$ or $Cu^{2+}$ ions to "catalyze" the wire formation over other morphologies. The controlled preparation of silver nanowires having the desired lengths and widths, however, is not known. For example, the $Fe^{2+}$ produces a wide variety of lengths or thicknesses and the $Cu^{2+}$ produces wires that are too thick for many applications.

When iron or copper are used, they are typically provided as the metal halide salts $FeCl_2$ or $CuCl_2$. See, for example, B. Wiley et al., *Nano Letters,* 2004, 4, 1733-1739 and K. E. Korte et al., *J. Mats. Chem.,* 2008, 18, 437. Other metal halide salts have been used in nanowire synthesis. See, for example, J. Jiu, K. Murai, D. Kim, K. Kim, K. Suganuma, *Mat. Chem. & Phys.,* 2009, 114, 333, which refers to $NaCl$, $CoCl_2$, $CuCl_2$, $NiCl_2$ and $ZnCl_2$, and S. Nandikonda, "Microwave Assisted Synthesis of Silver Nanorods," M.S. Thesis, Auburn University, Auburn, Ala., USA, Aug. 9, 2010, which refers to NaCl, KCl, $MgCl_2$, $CaCl_2$, $MnCl_2$, $CuCl_2$, and $FeCl_3$, and Japanese patent application publication 2009-155674, which discloses $SnCl_4$. See also S. Murali et al., *Langmuir,* 2010, 26(13), 11176-83; Z. C. Li et al., *Micro & Nano Letters,* 2011, 6(2), 90-93; and B. J. Wiley et al., *Langmuir,* 2005, 21, 8077. Japanese patent application publication 2009-155674 discloses $SnCl_4$.

Korean patent publication KR2011128152A, published Nov. 28, 2011, discloses preparation of branched nanowires via vapor deposition methods. Korean patent publication KR2012005683A, published Jan. 17, 2012, discloses preparation of branched nanowires in the presence of branched metal nanoseeds.

SUMMARY

At least a first embodiment provides methods comprising providing at least one first reducible metal ion; and reducing the at least one first reducible metal ion to at least one first branched metal nanowire in the presence of at least one of a second metal ion differing in atomic number from that of the at least one first reducible metal ion, or a compound capable of forming at least one halide ion, or the at least one halide ion formed by the at least one compound.

In at least some cases, the at least one second metal ion comprises at least one of an ion of an IUPAC Group 5 element, or an one ion of an IUPAC Group 6 element, or an ion of an IUPAC Group 8 element. Exemplary second metal ions are vanadium ions, tungsten ions, and ruthenium ions.

In at least some cases, the at least one compound comprises at least one of a boron atom, a nitrogen atom, a phosphorus atom, a silicon atom, a sulfur atom, a selenium atom, or a carbon atom. Such a compound may, for example, comprise at least one phosphonium salt. Tetraphenylphosphonium chloride is an exemplary compound. In some cases, such a compound may comprise an organohalide, such as, for example, benzyl chloride.

In at least some cases, the at least one first reducible metal ion comprises at least of a coinage metal ion, or an ion of an IUPAC Group 11 element, or a silver ion.

In at least some embodiments, the reduction occurs in the presence of at least one of a protecting agent or a polyol. Polyvinylpyrrolidone is an exemplary protecting agent. Ethylene glycol and propylene glycol are exemplary polyols.

Other embodiments provide the branched metal nanowires according to such methods. Such branched nanowires may have one branch point, or they may have two branch points, or they may have more than two branch points.

At least a second embodiment provides methods comprising providing at least one first composition comprising at least one first reducible metal ion, and reducing the at least one first reducible metal ion to at least one first branched metal in the presence of at least one second metal ion comprising at least one IUPAC Group 8 element.

In such methods, the at least one first reducible metal ion may, for example, comprise at least one coinage metal ion, or at least one ion of an IUPAC Group 11 element, such as, for example, at least one silver ion. In at least some embodiments, the at least one first composition comprises silver nitrate.

In such methods, the at least one second metal ion may, for example, comprise a ruthenium ion. In some cases, the at least one second metal ion may comprise ruthenium in its +3 oxidation state.

In such methods, the reduction of the first reducible metal ion may, in some cases, occur in the presence of either or both of at least one protecting agent or at least one polyol.

Some embodiments provide products comprising the at least one first branched metal produced by such methods. In some cases, such products may comprise at least one branched metal nanowire.

Other embodiments provide articles comprising such products.

Still other embodiments provide compositions comprising at least one branched metal nanowire and at least one ion of an IUPAC Group 8 element. In some cases, the at least one branched metal nanowire comprises at least one branched silver nanowire. Such a branched metal nanowire may, for example, comprise an average diameter between about 10 nm and about 500 nm. Or such a branched metal nanowire may, for example, comprise an aspect ratio between about 50 and about 10,000. Or such a branched metal nanowire may, for example, comprises an average diameter between about 10 nm and about 150 nm, and an aspect ratio between about 50 and about 10,000. Such a branched metal nanowire may, for example, comprise one or more branch points, or two or more branch points, or more than two branch points.

Yet still other embodiments provide products comprising such branched metal nanowires or articles comprising such products. Non-limiting examples of such articles include electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

These embodiments and other variations and modifications may be better understood from the brief description of the drawings, description, exemplary embodiments, examples, figures, and claims that follow. Any embodiments provided are given only by way of illustrative example. Other desirable objectives and advantages inherently achieved may occur or become apparent to those skilled in the art.

DESCRIPTION

Figure 1:
FIG. 1 shows an optical micrograph of the branched silver nanowire product of Example 1.

All publications, patents, and patent documents referred to in this document are incorporated by reference herein in their entirety, as though individually incorporated by reference. Reference to or incorporation of any reference in this application is not an admission that the reference is prior art.

U.S. provisional application No. 61/488,992, filed May 23, 2011, entitled BRANCHED NANOWIRE PREPARATION METHODS, COMPOSITIONS, AND ARTICLES, is hereby incorporated by reference in its entirety.

Reducible Metal Ions and Metal Products

Some embodiments provide methods comprising reducing at least one reducible metal ion to at least one metal. A reducible metal ion is a cation that is capable of being reduced to a metal under some set of reaction conditions. In such methods, the at least one first reducible metal ion may, for example, comprise at least one coinage metal ion. A coinage metal ion is an ion of one of the coinage metals, which include copper, silver, and gold. Or such a reducible metal ion may, for example, comprise at least one ion of an IUPAC Group 11 element. An exemplary reducible metal ion is a silver cation. Such reducible metal ions may, in some cases, be provided as salts. For example, silver cations might, for example, be provided as silver nitrate.

In such embodiments, the at least one branched metal is that metal to which the at least one reducible metal ion is capable of being reduced. For example, branched silver would be the metal to which a silver cation would be capable of being reduced.

Nanostructures, Nanostructures, and Nanowires

In some embodiments, the metal product formed by such methods is a nanostructure, such as, for example, a one-dimensional nanostructure. Nanostructures are structures having at least one "nanoscale" dimension less than 300 nm, and at least one other dimension being much larger than the nanoscale dimension, such as, for example, at least about 10 or at least about 100 or at least about 200 or at least about 1000 times larger. Examples of such nanostructures are nanorods, nanowires, nanotubes, nanopyramids, nanoprisms, nanoplates, and the like. "One-dimensional" nanostructures have one dimension that is much larger than the other two dimensions, such as, for example, at least about 10 or at least about 100 or at least about 200 or at least about 1000 times larger.

Such one-dimensional nanostructures may, in some cases, comprise nanowires. Nanowires are one-dimensional nanostructures in which the two short dimensions (the thickness dimensions) are less than 300 nm, preferably less than 100 nm, while the third dimension (the length dimension) is greater than 1 micron, preferably greater than 10 microns, and the aspect ratio (ratio of the length dimension to the larger of the two thickness dimensions) is greater than five. Nanowires are being employed as conductors in electronic devices or as elements in optical devices, among other possible uses. Silver nanowires are preferred in some such applications.

In some embodiments, the metal product may comprise branched metal, such as, for example, branched nanowires. An exemplary branched nanowire is branched silver nanowire. For such a branched nanowire, its length is defined as the largest distance along the nanowire between all possible pairs of its ends. Its aspect ratio is defined as its length divided by the average diameter between the pair of ends having that largest distance separation along the nanowire.

Such methods may be used to prepare nanostructures other than nanowires, such as, for example, nanocubes, nanorods, nanopyramids, nanotubes, and the like. Nanowires and other nanostructure products, including branched nanowires, may be incorporated into articles, such as, for example, electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

Preparation Methods

A common method of preparing nanostructures, such as, for example, nanowires, is the "polyol" process. Such a process is described in, for example, *Angew. Chem. Int. Ed.* 2009, 48, 60, Y. Xia, Y. Xiong, B. Lim, S. E. Skrabalak, which is hereby incorporated by reference in its entirety. Such processes typically reduce a metal cation, such as, for example, a silver cation, to the desired metal nanostructure product, such as, for example, a silver nanowire. Such a reduction may be carried out in a reaction mixture that may, for example, comprise one or more polyols, such as, for example, ethylene glycol (EG), propylene glycol (PG), butanediol, glycerol, sugars, carbohydrates, and the like; one or more protecting agents, such as, for example, polyvinylpyrrolidinone (also known as polyvinylpyrrolidone or PVP), other polar polymers or copolymers, surfactants, acids, and the like; and one or more metal ions. These and other components may be used in such reaction mixtures, as is known in the art. The reduction may, for example, be carried out at one or more temperatures from about 90° C. to about 190° C.

IUPAC Group 5 Metal Ions

The Applicant has discovered that IUPAC Group 5 ions, such as, for example, vanadium as $V^{3+}$, can be used to prepare branched silver nanowires. It is believed that other metal ion oxidation states, such as, for example, +4 or +5, may also provide useful results. It is notable that there has been no published account of a catalyst in its +3 oxidation state for the manufacture of branched silver nanowires.

In some embodiments, the reduction of the reducible metal ion occurs in the presence of at least one second metal ion comprising at least one IUPAC Group 5 element. Such a reduction may, for example, occur in the presence of at least one IUPAC Group 5 element in its +3, +4, +5, or other oxidation states. An exemplary second metal ion is $V^{3+}$. Such an ion may, for example, be provided by such compounds as vanadium (III) chloride. It has been discovered that the product of such a reduction comprises branched nanowires.

IUPAC Group 6 Metal Ions

The Applicant has discovered that IUPAC Group 6 ions, such as, for example, tungsten as $W^{4+}$, can be used to prepare branched silver nanowires. It is believed that other metal ion oxidation states, such as, for example, +5 or +6, may also provide useful results. It is notable that there has been no published account of a catalyst in its +4 oxidation state for the manufacture of branched silver nanowires.

In some embodiments, the reduction of the reducible metal ion occurs in the presence of at least one second metal ion comprising at least one IUPAC Group 6 element. Such a reduction may, for example, occur in the presence of at least one IUPAC Group 6 element in its +4, +5, +6, or other oxidation states. An exemplary second metal ion is $W^{4+}$. Such an ion may, for example, be provided by such compounds as tungsten (IV) chloride. It has been discovered that the product of such a reduction comprises branched nanowires.

IUPAC Group 8 Metal Ions

The Applicant has discovered that IUPAC Group 8 ions, such as, for example, ruthenium as $Ru^{3+}$, can be used to prepare branched silver nanowires. It is believed that other metal ion oxidation states, such as, for example, +2 or +4, may also provide useful results. It is notable that there has been no published account of a catalyst in its +3 oxidation state for the manufacture of branched silver nanowires.

In some embodiments, the reduction of the reducible metal ion occurs in the presence of at least one second metal ion comprising at least one IUPAC Group 8 element. Such a reduction may, for example, occur in the presence of at least one IUPAC Group 8 element in its +2, +3, +4, or other oxidation states. An exemplary second metal ion is $Ru^{3+}$. Such an ion may, for example, be provided by such compounds as ruthenium (III) chloride. It has been discovered that the product of such a reduction comprises branched nanowires.

Compounds Capable of Forming Halide Ions

Some embodiments provide methods comprising reducing metal ions to branched metal nanowires in the presence of at least one compound capable of forming at least one halide ion, or in the presence of the halide ion so formed, or both.

In such methods, the compound may, for example, comprise at least one of a boron atom, a nitrogen atom, a phosphorus atom, a silicon atom, a sulfur atom, a selenium atom, or a carbon atom. Or, in some cases, the compound may comprise at least one of a boron atom, a phosphorus atom, a silicon atom, or a carbon atom.

In some cases, the at least one halide ion may, for example, comprise at least one chloride ion, bromide ion, or iodide ion. Or, in some cases, the at least one halide may comprise at least one chloride ion or bromide ion.

In at least some embodiments, the compound may comprise at least one phosphonium salt, such as, for example, tetraphenylphosphonium chloride.

In at least some embodiments, the compound may comprise at least one organohalide, such as, for example, benzyl chloride.

Exemplary Embodiments

U.S. provisional application No. 61/488,992, filed May 23, 2011, entitled BRANCHED NANOWIRE PREPARATION METHODS, COMPOSITIONS, AND ARTICLES, which is hereby incorporated by reference in its entirety, disclosed the following 21 non-limiting exemplary embodiments:

A. A method comprising:
providing at least one first composition comprising at least one first reducible metal ion; and
reducing the at least one first reducible metal ion to at least one first branched metal in the presence of at least one second metal ion comprising at least one IUPAC Group 8 element.

B. The method according to embodiment A, wherein the at least one first reducible metal ion comprises at least one coinage metal ion.
C. The method according to embodiment A, wherein the at least one first reducible metal ion comprises at least one ion of an IUPAC Group 11 element.
D. The method according to embodiment A, wherein the at least one first reducible metal ion comprises at least one silver ion.
E. The method according to embodiment A, wherein the at least one composition comprises silver nitrate.
F. The method according to embodiment A, wherein the at least one second metal ion comprises a ruthenium ion.
G. The method according to embodiment A, wherein the at least one second metal ion comprises ruthenium in its +3 oxidation state.
H. The method according to embodiment A, wherein the reduction occurs in the presence of at least one protecting agent.
J. The method according to embodiment A, wherein the reduction occurs in the presence of at least one polyol.
K. A product comprising the at least one first branched metal produced by the method according to embodiment A.
L. The product according to embodiment K comprising at least one branched metal nanowire.
M. An article comprising the product according to embodiment K.
N. A composition comprising at least one branched metal nanowire, at least one chloride ion, and at least one ion of an IUPAC Group 8 element.
P. The composition according to embodiment N, wherein the at least one branched metal nanowire comprises at least one branched silver nanowire.
Q. The composition according to embodiment N, wherein the at least one branched metal nanowire comprises an average diameter between about 10 nm and about 500 nm.
R. The composition according to embodiment N, wherein the at least one branched metal nanowire comprises an aspect ratio between about 50 and about 10,000.
S. The composition according to embodiment N, wherein the at least one branched metal nanowire comprises an average diameter between about 10 nm and about 150 nm, and an aspect ratio between about 50 and about 10,000.
T. The composition according to embodiment N, wherein the at least one branched metal nanowire comprises two or more branch points.
U. A product comprising the at least one branched metal nanowire of the composition of embodiment N.
V. An article comprising the at least one product according to embodiment U.
W. The article according to embodiment V comprising at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, a medical imaging device, or a medical imaging medium.

EXAMPLES

Example 1

To a 500 mL reaction flask containing 280 mL ethylene glycol (EG), 1.7 g of a 7.5 mM solution of ruthenium (III) chloride in EG was added at room temperature. The mixture was agitated at 100 rpm and stripped of at least some dissolved gases by bubbling nitrogen into the solution using a glass pipette for 2 hrs. (This operation will be referred to as "degassing" in the sequel.) Stock solutions of 0.25 M $AgNO_3$ in EG and 0.77 M polyvinylpyrrolidinone (PVP) in EG were also degassed with nitrogen for 60 min, then 20 mL syringes of each were prepared. The flask was then heated to 145° C. while degassing by bubbling nitrogen through its contents. The $AgNO_3$ and PVP solutions were then added at a constant rate over 25 min via a 12 gauge a TEFLON® fluoropolymer syringe needle. The flask was then held at temperature for 90 min, after which it was allowed to cool down to ambient temperature.

Figure 2:
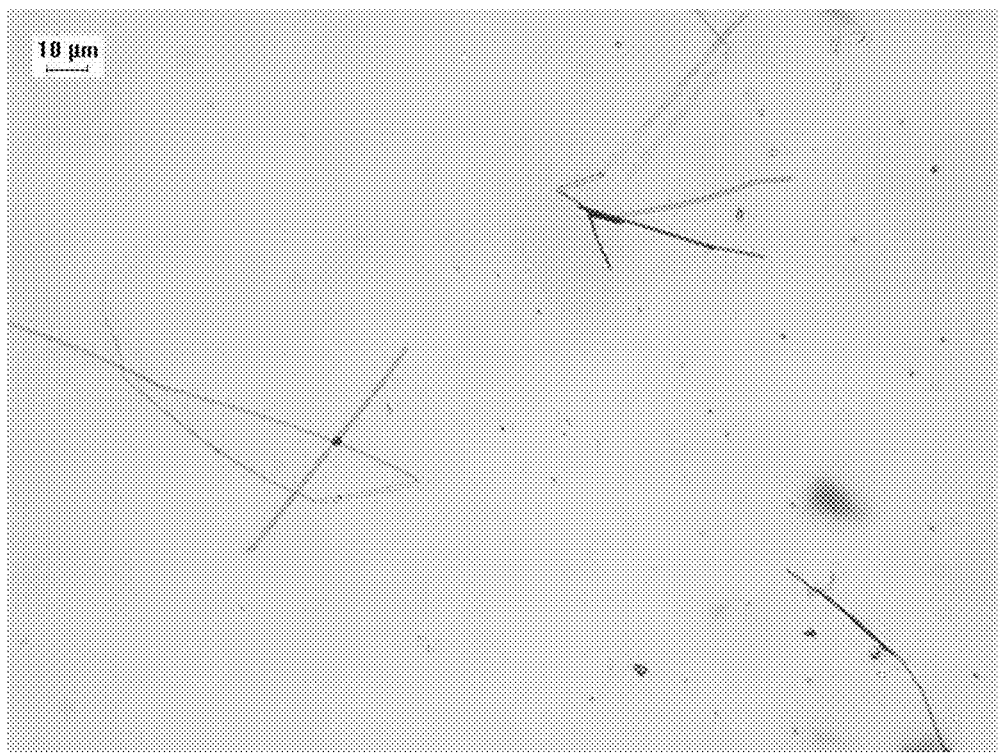
FIG. 2 shows an optical micrograph of the branched silver nanowire product of Example 1.

The reaction product was diluted with an equal volume of acetone, then centrifuged at 500 G for 45 min. The decanted solid was redispersed in 200 mL isopropanol, shaken 10 min, and then centrifuged, decanted, and redispersed in 15 mL isopropanol. Optical micrographs of the branched silver nanowire product, approximately 10 µm in length, is shown in FIGS. 1 and 2. Branched silver nanowires having one branch point, two branch points, and more than two branch points can be seen.

Example 2

To a 500 mL reaction flask containing 280 mL EG, 3.3 g of a 3 mM solution of iron (II) acetylacetone in EG, and 0.16 g of a freshly prepared 0.27 M solution of benzylchloride in EG were added at room temperature. The mixture was agitated at 100 rpm and degassed with nitrogen using a glass pipette for 2 hrs. Stock solutions of 0.25 M $AgNO_3$ in EG and 0.84 M polyvinylpyrrolidinone (PVP) in EG were also degassed with nitrogen for 60 min, then 20 mL syringes of each were prepared. The flask was then heated to 155° C. while degassing by bubbling nitrogen through its contents. The $AgNO_3$ and PVP solutions were then added at a constant rate over 25 min via a 12 gauge a TEFLON® fluoropolymer syringe needle. The flask was then held at temperature for 90 min, after which it was allowed to cool down to ambient temperature.

Figure 3:
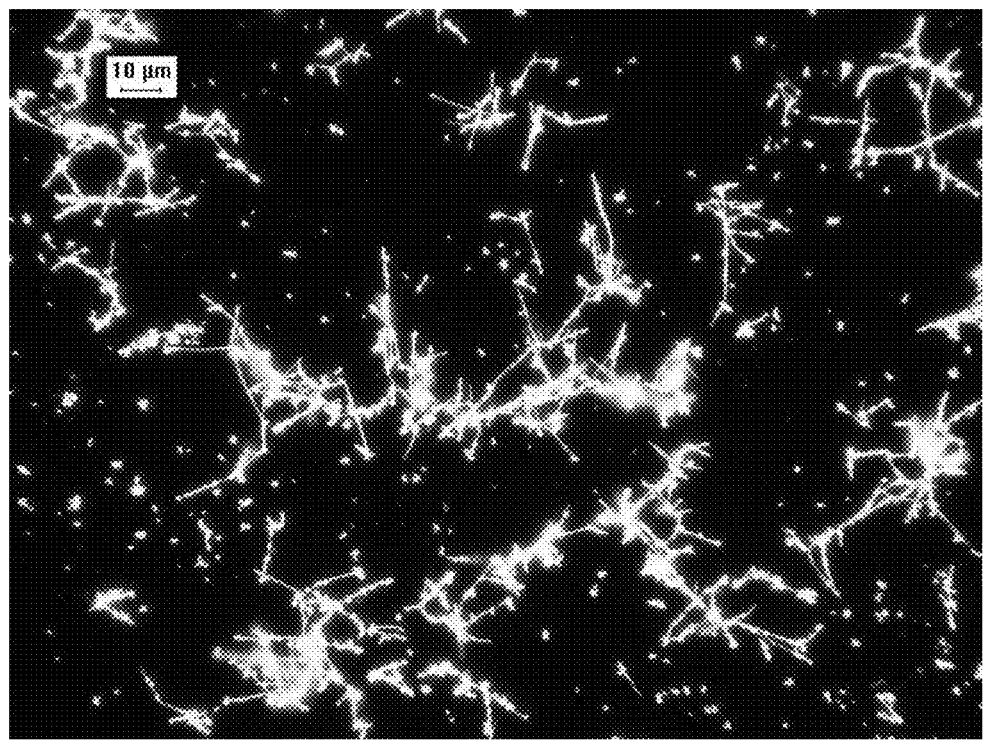
FIG. 3 shows an optical micrograph of the branched silver nanowire product of Example 2.

FIG. 3 shows an optical micrograph of the branched nanowire reaction product.

Example 3

To a 500 mL reaction flask containing 260 mL propylene glycol (PG), 4.5 g of PVP was added. The headspace of the mixture was blanketed with 0.5 mL/min of nitrogen. The mixture was agitated at 200 rpm and heated to 110° C. Stock solutions of 1.0 M $AgNO_3$ in PG and 19.3 mM tetraphenylphosphonium chloride in PG were also degassed with nitrogen for 60 min, then 24 mL syringes of each were prepared. The $AgNO_3$ solution was added to the reaction flask at a rate of 0.2 mL/min via a TEFLON® fluoropolymer syringe needle. Ten minutes after initiating the addition of the $AgNO_3$ solution, addition of the tetraphenylphosphonium chloride solution at a rate of 1.2 mL/min via a separate syringe pump commenced. 20 mL of a stock solution was prepared consisting of 0.8 mL of 70% aqueous $HNO_3$, 3.0 mL of water, and the balance being PG. This solution was added to the reaction mixture at a rate of 0.4 mL, with this addition commencing 78 minutes after initiating the addition of the $AgNO_3$ solution. The reaction was allowed to continue for 3 hrs.

Figure 4:
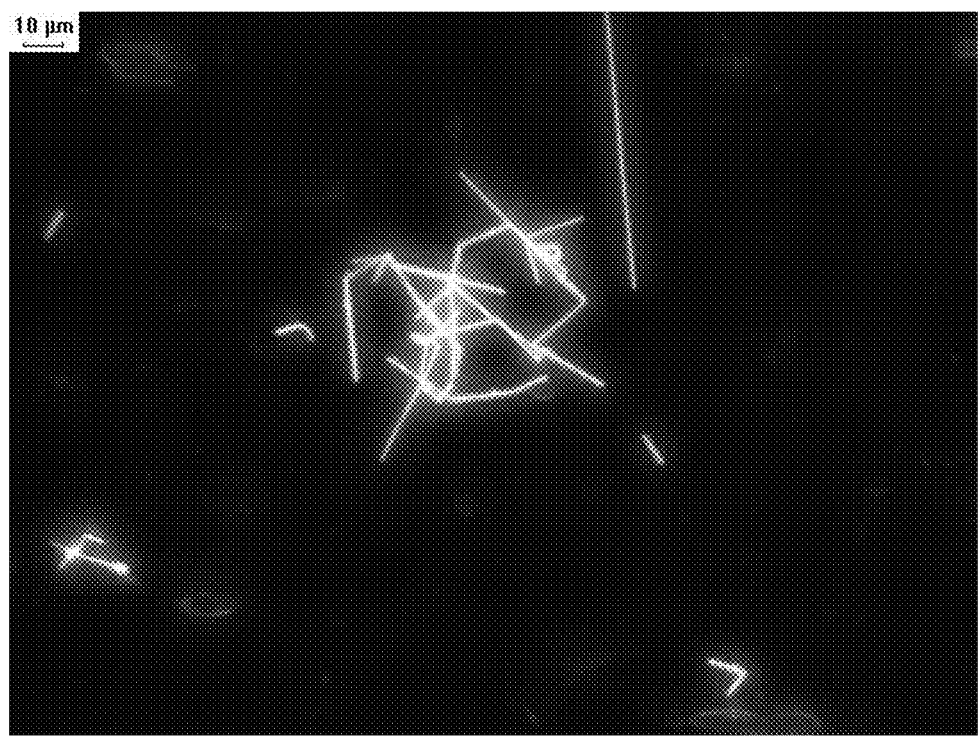
FIG. 4 shows an optical micrograph of the branched silver nanowire product of Example 3.
Figure 5:
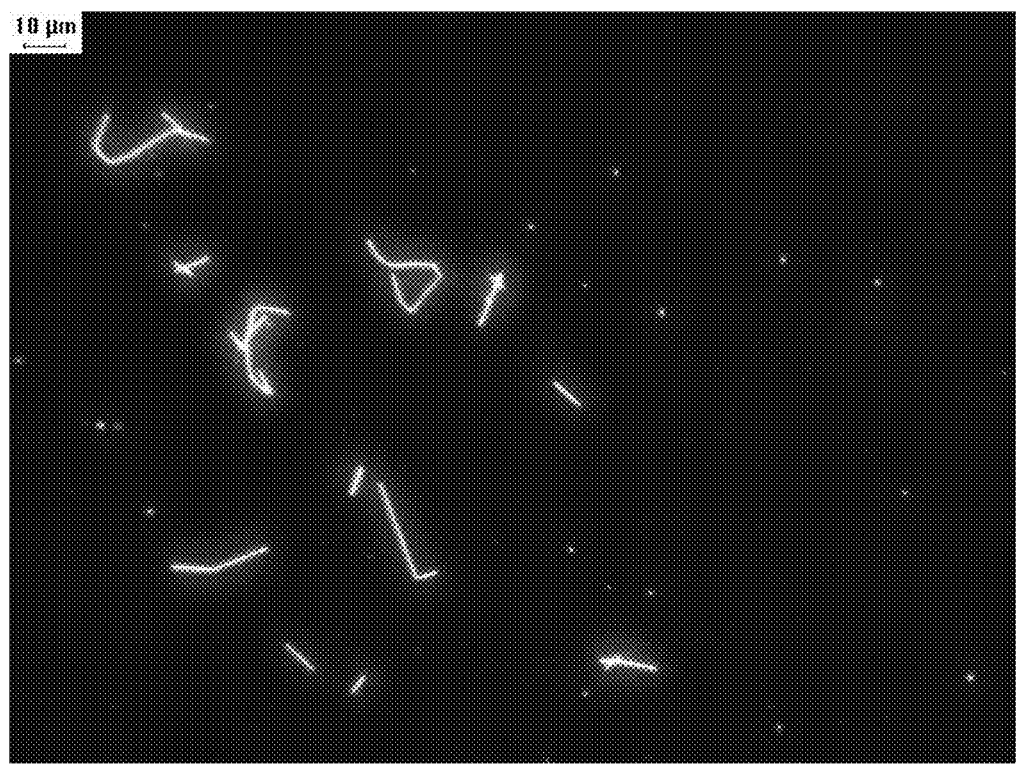
FIG. 5 shows an optical micrograph of the branched silver nanowire product of Example 3.

FIGS. 4 and 5 show optical micrographs of the branched silver nanowire product.

Example 4

To a 500 mL reaction flask containing 300 mL PG, 1.9 g of polyvinylpyrrolidinone (PVP) and 17.9 mg of tungsten (IV) chloride was added at room temperature. The mixture was agitated at 150 rpm and degassed overnight with nitrogen using a TEFLON® fluoropolymer tube. The tube was then retracted from the reaction mixture to provide nitrogen blanketing at 0.5 L/min and the reaction mixture was heated to 125° C. A stock solution of 0.50 M $AgNO_3$ in PG was also degassed with nitrogen for 60 min, then a 20 mL syringe of the solution was prepared. The $AgNO_3$ solution was then added at a constant rate over 25 min via a 12 gauge a TEFLON® fluoropolymer syringe needle. The flask was then held at temperature for 60 min, after which it was allowed to cool down to ambient temperature. Branched nanowires were contained in the reaction product.

Example 5

To a 500 mL reaction flask containing 300 mL PG, 1.9 g of polyvinylpyrrolidinone (PVP) and 9.3 mg of vanadium (III) chloride was added at room temperature. The mixture was agitated at 150 rpm and degassed overnight with nitrogen using a TEFLON® fluoropolymer tube. The tube was then retracted from the reaction mixture to provide nitrogen blanketing at 0.5 L/min and the reaction mixture was heated to 125° C. A stock solution of 0.50 M $AgNO_3$ in PG was also degassed with nitrogen for 60 min, then a 20 mL syringe of the solution was prepared. The $AgNO_3$ solution was then added at a constant rate over 25 min via a 12 gauge a TEFLON® fluoropolymer syringe needle. The flask was then held at temperature for 60 min, after which it was allowed to cool down to ambient temperature. Branched nanowires were contained in the reaction product.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

What is claimed:

1. A method comprising:
   providing at least one silver ion; and
   reducing the at least one silver ion to at least one branched silver nanowire in the presence of:
   at least one of a protecting agent or a polyol, and
   at least one of a compound selected from tetraphenylphosphonium chloride or benzyl chloride, or at least one chloride ion formed by the at least one compound.

2. The method according to claim 1, wherein the at least one branched silver nanowire comprises two or more branch points.

* * * * *